United States Patent [19]
Landsbergen et al.

[11] Patent Number: 5,868,914
[45] Date of Patent: Feb. 9, 1999

[54] MAGNETRON SPUTTERING SYSTEM

[75] Inventors: Jeroen F.M. Landsbergen, Best; Jan Visser, Weert, both of Netherlands

[73] Assignee: ODME International B.V., Veldhoven, Netherlands

[21] Appl. No.: 634,901

[22] Filed: Apr. 12, 1996

[30] Foreign Application Priority Data

Apr. 13, 1995 [NL] Netherlands ............................ 1000139

[51] Int. Cl.$^6$ ................................................. C23C 14/35
[52] U.S. Cl. ............................... 204/298.06; 204/298.06; 204/298.11; 204/298.14; 204/298.19
[58] Field of Search .......................... 204/298.06, 298.11, 204/298.14, 298.16, 298.17, 298.18, 298.19, 298.12

[56] References Cited

U.S. PATENT DOCUMENTS

| | | | |
|---|---|---|---|
| 4,427,524 | 1/1984 | Crombeen et al. | 204/298.19 |
| 4,461,688 | 7/1984 | Morrison, Jr. | 204/298.19 |
| 4,892,633 | 1/1990 | Welty | 204/298.19 |
| 4,943,363 | 7/1990 | Zejda et al. | 204/298.11 |
| 5,174,880 | 12/1992 | Bourez et al. | 204/298.19 |

FOREIGN PATENT DOCUMENTS

| | | |
|---|---|---|
| 0095211 | 11/1983 | European Pat. Off. . |
| 0645798 A1 | 3/1995 | European Pat. Off. . |

OTHER PUBLICATIONS

Patent Abstracts of Japan, vol. 11, No. 38, Apr. 4, 1987, JP1204371, Oct. 9, 1986.
Patent Abstracts of Japan, vol. 11, No. 38, Apr. 2, 1987, JP61204371, Oct. 9, 1986.
J. Visser, J.E. Crombeen, D.C. Planar Magnetron Sputtering Source for Video Disc Metallization, Oct. 22, 1984, Vakuum–Technik 34 Jahrgange Heft 3, pp. 67–77, Search Report, Jan. 17, 1996.

*Primary Examiner*—Nam Nguyen
*Assistant Examiner*—Rodney G. McDonald
*Attorney, Agent, or Firm*—Pillsbury Madison & Sutro LLP

[57] ABSTRACT

A magnetron sputtering system comprising a sputtering chamber. Present within the chamber are a flat cathode plate, an anode, which is cylindrical in one embodiment, and an annular auxiliary electrode. The electrodes are provided co-axially. In this embodiment the anode extends axially from a central area of the sputtering surface of the cathode plate. The auxiliary electrode extends axially from a circumferential area of the sputtering surface of the cathode plate. The anode is electrically insulated from the cathode plate. During operation the auxiliary electrode has a negative potential in relation to the anode potential. Furthermore the chamber comprises a receiving device for receiving a flat substrate to be coated with cathode plate material at a position opposite and parallel to the cathode plate. A magnetic device is provided outside the chamber for generating an electron trap around the anode, which magnetic device is surrounded by the auxiliary electrode. The magnetic device generates an asymmetric magnetic field. The auxiliary electrode enhances the interception of electrons in the electron trap.

15 Claims, 2 Drawing Sheets

MAGNETRON SPUTTERING SYSTEM

BACKGROUND OF THE INVENTION

1. Field of the Invention

The invention relates to a magnetron sputtering system comprising a chamber, and present within said chamber a flat cathode plate, an anode, an annular auxiliary electrode, which extends axially from a circumferential area of a sputtering surface of said cathode plate, is positioned co-axially with said cathode plate and during operation has a negative potential in relation to the anode potential, and a receiving device for receiving a flat substrate to be coated with cathode plate material at a position opposite and parallel to said cathode plate, and present outside said chamber a magnetic device for generating an electron trap over part of an intermediate area of the sputtering surface of the cathode plate located between a central area and said circumferential area, said device being surrounded by said annular auxiliary electrode.

2. Description of the Prior Art

A magnetron sputtering system of this type is known from European Patent 0 095 211 (the description as well as the claims and the drawing of which patent are considered to be incorporated herein by this reference).

In the known system the cylindrical electrode is a bar-shaped auxiliary electrode, and an annular anode co-axial with the cathode plate is provided, whereby the bar-shaped auxiliary electrode is disposed spaced from the substrate and a device is provided for varying the potential of the annular (tubular) auxiliary electrode in such a manner, that electrons are directed to the annular electrode during operation of the system.

The known system prevents the substrate from being damaged by electrons striking the substrate.

The known system is in particular used for the coating of substrates of temperature-sensitive optical registration carriers having a diameter of about 30 cm.

The operation of the known system will be briefly discussed below by way of supplement to the disclosure of the aforesaid patent.

A magnetron sputtering system distinguishes itself from other sputtering systems by the high rate at which cathode plate material is deposited on a substrate to be coated. This high deposition rate is achieved by an efficient trapping of electrons, as a result of which the gas discharge in the chamber of the magnetron sputtering system is able to produce a strong influx of ions to the cathode plate. This trapping of electrons is efficient because electrons moving away from the cathode plate as a result of the gas discharge are confined in a magnetic field. The magnetic field component parallel to the sputtering surface of the cathode plate, combined with the electric field perpendicular to the dark space on the sputtering surface, forces the electrons into a cycloid orbit, which, as soon as an electron leaves the dark space, changes into a circular orbit in a direction of movement perpendicular to the magnetic field component parallel to the sputtering surface as well as to the electric field. If no collisions take place, the electrons cannot move further away from the sputtering surface than the maximum height of the cycloid orbit or the radius of curvature of the circular orbit. By closing the orbit through which the electrons hop at a short distance from the sputtering surface, the electrons will remain at said short distance from the sputtering surface, unless collisions cause them to move out of the sphere of influence of the magnetic field.

Since the magnetic device is disposed on the cathode plate surface opposite the sputtering surface, the magnetic field is not uniform, which results in a magnetic field component perpendicular to the sputtering surface. More specifically, the magnetic field lines form an arc above the sputtering surface. Neither the perpendicular nor the parallel magnetic field component have a constant value between the point of entry and the point of exit of the magnetic field lines, and the perpendicular field component is reversed. The hopping which is imparted to the electrons under the influence of the parallel magnetic field component takes place in a direction perpendicular to the perpendicular magnetic field component. As a result of that a movement parallel to the sputtering surface is superposed on the hopping. Such a lateral movement is not imparted to electrons which are hopping in an orbit where the perpendicular magnetic field component is reversed, or, in other words, is zero. Electrons which start in another orbit, are subjected to a force in the direction of the orbit where the perpendicular magnetic field component is reversed. They hop and move in zigzag fashion in the closed orbit close to the sputtering surface of the cathode plate.

In the above-described manner a high-density annular plasma is formed close to the sputtering surface of the cathode plate. This plasma does not have a uniform density, however. In those places where the magnetic field component parallel to the sputtering surface becomes weaker, the distance which the electrons are able to move away from the sputtering surface becomes larger and thus the possibility of escape becomes greater. Consequently the erosion of the sputtering surface of the cathode plate does not take place in a uniform fashion. The consumptive use of cathode material is greatest in those places where the magnetic field component perpendicular to the sputtering surface is reversed. This non-uniform use is a drawback of the process of sputtering with a magnetron sputtering system. Further drawbacks resulting therefrom include a shorter life of the cathode plate, increased material costs as a consequence of a change in the plasma impedance which is greater than in the case of a uniform erosion, a reduced deposition rate, because part of the sputtered material is caught in an erosion groove, etc.

The above drawbacks become more serious as the size of the cathode plate decreases, as is for example the case when a smaller substrate is to be coated with cathode plate material, since the magnetic field gradients will increase in that case. After all, a sufficiently strong magnetic field component parallel to the sputtering surface of the cathode plate is required, whilst the distance between the points where the magnetic field intersects the sputtering surface becomes smaller. This implies that the variations in the uniformity of erosion are comparatively greater when smaller cathode plates are used.

In order to solve the above problem a comparatively large cathode plate is used for coating a small substrate so as to obtain the desired operational life of said cathode plate. A drawback of this solution is, however, that a large part of the sputtered cathode plate material does not land on the substrate to be coated, as a consequence of which the chamber needs to be opened frequently in order to remove the material from the cathode plate that has not landed on the substrate.

SUMMARY OF THE INVENTION

The object of the invention is to improve the uniformity of erosion in the case of sputtering from a flat cathode plate to such an extent that it is possible to use a cathode plate having minimal dimensions, for example in principle the same dimensions as those of the substrate to be coated, and to improve the transfer of sputtered material to the substrate.

In order to accomplish that objective the invention provides a magnetron sputtering system of the kind referred to in the introduction, which is characterized in that said magnetic device generates an asymmetric magnetic field, in such a manner that, seen from the geometrical set of points where the direction of the perpendicular magnetic field component is reversed, the field strength of the magnetic field components parallel and perpendicular to the cathode plate is smaller in the direction of the circumferential area of the cathode plate than in the direction of the central area of the cathode plate.

The result of this asymmetric magnetic field is that the driving force which acts laterally on the hopping is stronger from the center towards the outside than from the edge towards the center. The difference between the density of the plasma on the geometric set of points where the perpendicular magnetic field component is reversed and the density of the plasma located therebeside is smaller than with the known magnetron sputtering system. The amount of erosion increases especially towards the outside, which results in an more efficient use of the cathode plate.

The drawback of using only the asymmetric magnetic field is that the loss of electrons is greater than is the case with the known magnetron sputtering system, since the driving force to the center is lacking or very small, and the parallel magnetic field component on the edge of the cathode plate is too small to keep the electrons close to the cathode plate.

That is the reason for using the annular auxiliary electrode, which may, for example, be electrically connected to the cathode plate. The auxiliary electrode exerts the required inward force on electrons which the asymmetric magnetic field is unable to provide. The height of the annular auxiliary electrode preferably corresponds with the radius of the hopping of electrons in the relatively weak magnetic field parallel to the cathode plate.

It will be appreciated that although the use of an annular auxiliary electrode is known per se, as it is used in the known magnetron sputtering system, its function in the present magnetron sputtering system is completely different, namely the generation of a radially inward force on the electrons. That force is not provided by the magnetic field, so that the electrons are trapped in the electron trap as yet, and not the directing of electrons towards the anode instead of towards the cathode.

In addition to that the annular auxiliary electrode catches the main part of the sputtered flux not moving in the direction of the substrate.

Since the annular auxiliary electrode has a negative potential in relation to the anode, also the auxiliary electrode is hit by ions to a certain extent. This ion bombardment has a twofold effect. In the first place part of the intercepted sputtered material is sputtered as yet, so that the material grows at a slower rate, and in the second place the material adheres quite well to the substrate, so that no material will peel off, which phenomenon is an undesirable side effect when a thick layer is deposited on chamber parts.

The magnetron sputtering system according to the present invention is quite suitable for coating CD's (diameter approx. 12 cm) and similar registration media with a metal.

BRIEF DESCRIPTION OF THE DRAWINGS

The invention will be explained in more detail below with reference to the drawings, in which.

DESCRIPTION OF THE DRAWINGS

Figure 1:
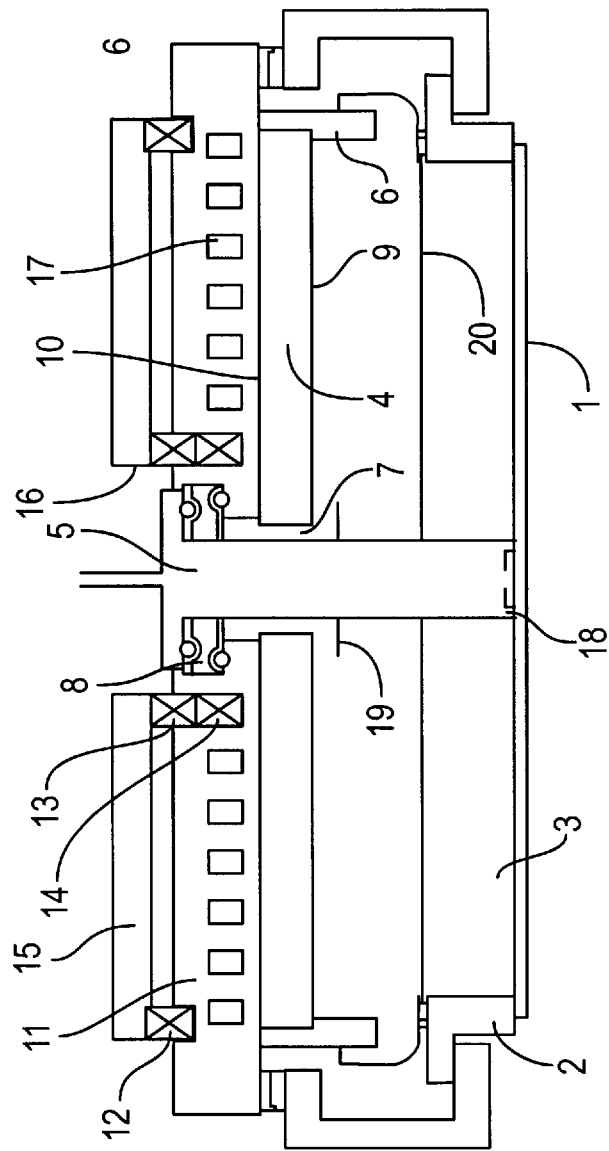
FIG. 1 is a highly diagrammatic sectional view, not to scale, of an embodiment of the magnetron sputtering system according to the invention.

The embodiment of the magnetron sputtering system according to the invention shown in FIG. 1 serves for sputtering a film of a metal on a CD-disc 1, which has been taken to a receiving device, in particular receiving ring 2, by a supporting device (not shown), so as to be received by the receiving ring and thus close a chamber 3 at the bottom side. Accommodated within chamber 3 are furthermore a flat cathode plate 4, a cylindrical (in this embodiment), more particularly a tubular anode 5, and an annular auxiliary electrode 6. In this embodiment the cathode plate 4 is circular and has a diameter of for example 140 mm, a thickness of 10 mm, as well as a central, circular through opening 7 for passing anode 5 therethrough from above. Cathode plate 4 may be made of aluminium. As is shown in FIG. 1, the tubular anode 5 extends axially from a central area of the cathode plate and is electrically insulated from cathode plate 4, more in particular by an insulation ring 8 provided within opening 7, whilst the annular auxiliary electrode 6 extends axially from a circumferential or edge area of a sputtering surface 9 of cathode plate 4 and is electrically connected to said cathode plate 4 in that it is mounted on cathode plate 4 without the interposition of any insulation material. In order to avoid any chance of undesirable material being sputtered from auxiliary electrode 6 to substrate 1, the auxiliary electrode 6 may be made of the same material as the cathode, instead of being made of, for example, stainless steel, and more in particular be formed in one piece therewith. In the Figure it can be seen that cathode plate 4, anode 5 and auxiliary electrode 6 are disposed co-axially and have a circular section.

A magnetic device is provided outside chamber 3, on a, surface 10 of the cathode plate 4 opposite the sputtering surface 9 thereof, said magnetic device in this embodiment comprising a supporting body 11 of for example copper, three annular permanent magnets 12, 13 and 14, and a circular yoke 15 with a central, circular through opening 16 formed therein, whereby the stacked-together permanent magnets 13 and 14 are mounted co-axially with opening 16 on said yoke, whilst permanent magnet 12 is mounted on a circumferential area of yoke 15. Finally the magnetic device includes coolant channels 17 formed in the supporting body 11.

The operation of a magnetron system is known to those skilled in the art. In this connection reference is furthermore made to the European patent mentioned in the introduction. In any case, the magnetic device disposed outside chamber 3 generates an electron trap over a part of an intermediate area of sputtering surface 9 of cathode plate 4 which is located between the central area and the circumferential area of cathode plate 4, which electron trap is positioned around anode 5 and is surrounded by auxiliary electrode 6. In accordance with the invention the magnetic device generates an asymmetric magnetic field instead of a symmetric magnetic field, and that in such a manner that, seen from the geometric set of points where the perpendicular magnetic field component is reversed, the field strength of the magnetic field components parallel and perpendicular to cathode plate 4 is smaller in the direction of the circumferential area of cathode plate 4 than in the direction of the central area of cathode plate 4. In FIG. 1 this has been achieved by stacking permanent magnet 13 on top of permanent magnet 14 and by leaving out such a stacked-together arrangement with regard to permanent magnet 12, as a result of which the combination of permanent magnets 13 and 14 is not only stronger than permanent magnet 12, but also positioned closer to cathode plate 4.

Figure 2:
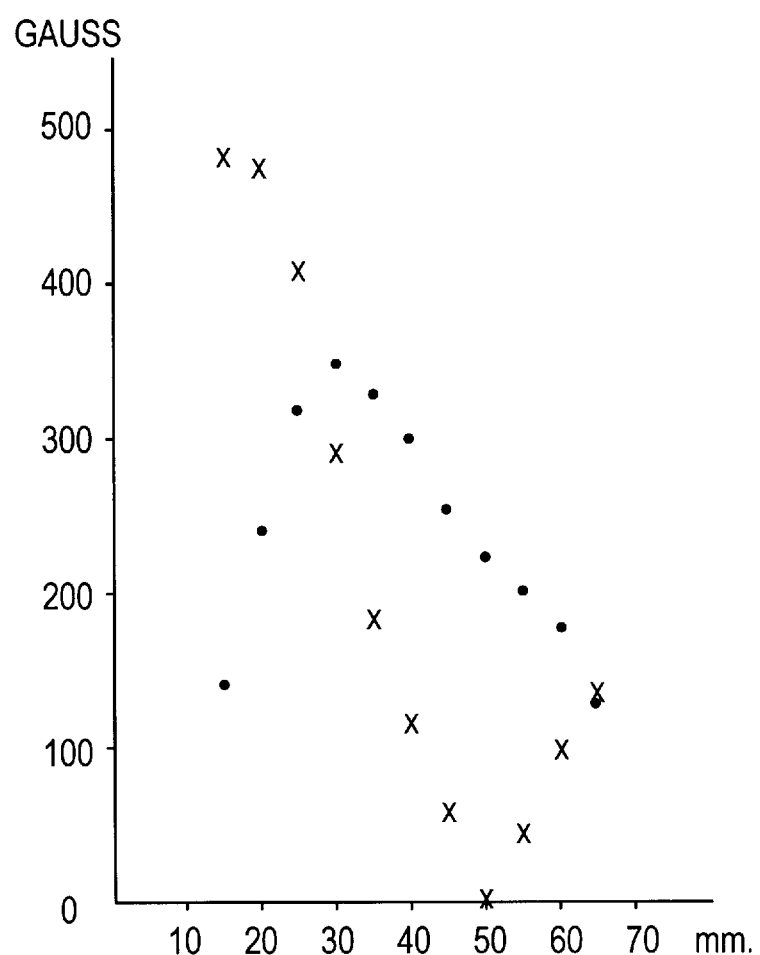
FIG. 2 shows a graph wherein the magnetic field strength is plotted as a function of the distance to the center of the magnetic device of the magnetron sputtering system shown in FIG. 1 for both the horizontal and the vertical component and for a discrete number of measuring points.

FIG. 2 shows a graph wherein the magnetic field strength (expressed in gauss) is plotted on the ordinate and wherein the radius from the center of the supporting body 11, or the center of cathode plate 4, is plotted on the abscissa. Symbol "●" indicates the horizontal component of the magnetic field generated by the magnetic device, whilst symbol "x" indicates the vertical component thereof. As can be seen, discrete measurements have taken place in 5 mm steps from a radius of 15 mm up to and including a radius of 65 mm. Measurements were made 15 mm below the lowermost magnet, that is, permanent magnet 14. The radius of the central line, circle, of permanent magnets 13 and 14 on the one hand and permanent magnet 12 on the other hand was 20.5 mm and 69 mm respectively, whilst, as already said before, the cathode plate had a diameter of 140 mm. The width and the height of permanent magnet rings of the permanent magnet rings 12–14 was 7 mm and 5 mm respectively, and said magnet rings were made of neodymium. Moreover, the inside circle line of permanent magnet 12 coincided with the side edge of the circular flat cathode plate 4.

As is shown in FIG. 2, the perpendicular magnetic field component is reversed at a radius of 50 mm and the geometric set of points on such a radius is a circle with a diameter of 100 mm. As is furthermore shown in FIG. 2, the (average) field strength of the magnetic field components parallel and perpendicular to cathode plate 4 is (considerably) smaller in the direction of the circumferential area of cathode plate 4 than in the direction of the central area of cathode plate 4. As is described in the introduction, the consequence of this is that the erosion of cathode plate 4 extends towards the outside. Auxiliary electrode 6 keeps electrons that would otherwise be lost in the vicinity of cathode plate 4.

FIG. 2 finally shows that close to the edge of cathode plate 4, near the vertical auxiliary electrode 6, the parallel component of the magnetic field is about 90 gauss. With such a value and with current densities and discharge voltages which are usual for the deposition of material on CD's the hopping will have a radius of curvature of about 10 mm. Consequently the annular auxiliary electrode 6, which must provide electrostatic trapping of electrons, must project at least 10 mm, seen from the sputtering surface 9 of cathode plate 4. In this embodiment the annular auxiliary electrode 6 is clamped down on the electrode plate 4 and as a result of that has the same potential as cathode plate 4.

Referring back to FIG. 1, it is noted that receiving ring 2 is formed in such a manner that it shields a circular edge area of the surface to the CD-disc to be coated, so that no metal will be deposited at that location, as is usual with CD-discs. At its end remote from the sputtering surface 9 of cathode plate 4 anode 5 is provided with a shielding part 18, which functions to keep a central circular area of CD-disc 1 clear of deposited metal. As is shown, the shielding part 18 of anode 5 abuts against substrate 1. Anode 5 is furthermore provided with a circular disc-shaped shielding part 19, which prevents the deposition of a metal on insulation ring 8. Finally a shield 20 is provided, which prevents other parts of the chamber 3 from being coated with a metal during the sputtering process by being coated itself instead. It is easier to remove and replace or clean said shield than dismounting and cleaning parts of chamber 3.

It is emphasized that the invention is not limited to the embodiment described above. Since the advantages of the invention include an improved consumptive use of the cathode plate 4 and a more uniform deposition on the substrate 1, the invention may also be used for coating substrates other than CD's, for example semiconductor substrates. The substrates do not have to be circular, therefore, they may also square, rectangular, polygonal, etc. In that case the electrodes and the like will have a shape analogous thereto. The other electrodes need not have the same potential as the anode, but their potential will have to be negative in relation to the anode potential. Moreover, the potentials applied may be variable. It is also possible to use electromagnets instead of permanent magnets. Furthermore it is possible to use one-piece magnets instead of stacked permanent magnets. On the other hand a permanent magnet may be built up of submagnets.

We claim:

1. A magnetron sputtering system comprising a chamber, and present within said chamber
   a flat cathode plate,
   an anode centrally positioned on said flat cathode plate,
   an annular auxiliary electrode, which extends axially from a circumferential area of a sputtering surface of said cathode plate, is positioned co-axially with said cathode plate and during operation has a negative potential in relation to the anode potential and thereby exerts an electric force in the direction of a central area of the cathode plate, said electric force directing electrons inwardly into a plasma field, and
   a receiving device for receiving a flat substrate to be coated with cathode plate material at a position opposite and parallel to said cathode plate, and present outside said chamber:
   a magnetic device for generating an electron trap over part of an intermediate area of the sputtering surface of the cathode plate located between a central area and said circumferential area, said electron trap being surrounded by said annular auxiliary electrode,
   whereby said magnetic device generates an asymmetric magnetic field, in such a manner that, seen from a geometrical set of points where a direction of a perpendicular magnetic field component is reversed, a field strength of magnetic field components parallel and perpendicular to the cathode plate is smaller in the direction of the circumferential area of the cathode plate than in the direction of the central area of the cathode plate.

2. A magnetron sputtering system according to claim 1, wherein said anode is cylindrical and extends in an axial direction from the central area of the sputtering surface of said cathode plate, which is provided co-axially with said cathode plate and which is electrically insulated from said cathode plate, whereby the electron trap is present around said cylindrical electrode.

3. A magnetron sputtering system according to claim 1, characterized in that said annular auxiliary electrode is mounted on said cathode plate in such manner as to make electric contact therewith.

4. A magnetron sputtering system according to claim 1, characterized in that said annular auxiliary electrode is clamped down on said cathode plate.

5. A magnetron sputtering system according to claim 1, characterized in that said annular auxiliary electrode is made of the same material as the cathode.

6. A magnetron sputtering system according to claim 5, characterized in that said annular auxiliary electrode and said cathode are integral with each other.

7. A magnetron sputtering system according to claim 1, characterized in that the distance over which said annular auxiliary electrode extends beyond the sputtering surface of the cathode plate within said chamber is larger than the radius of the movement of electrons in said electron trap.

8. A magnetron sputtering system according to claim 1, characterized in that said anode is passed through a central through opening of the cathode plate with the interposition of an insulation ring.

9. A magnetron sputtering system according to claim 8, characterized in that said anode present within said chamber is provided with a shielding part at a location which is related to the position of the passage through said cathode plate, which shielding part functions to prevent the deposition of material on said insulation ring.

10. A magnetron sputtering system according to claim 1, characterized in that an end of said anode projecting into said chamber is arranged for abutment against said substrate to be coated, said end being configured such that a circular central area of said substrate is shielded from the deposition of material.

11. A magnetron sputtering system according to claim 1, characterized in that said receiving device is arranged for receiving said substrate to be coated in such a manner that a circumferential edge area of said substrate is shielded from the deposition of material.

12. A magnetron sputtering system according to claim 1, characterized in that a shield is provided within said chamber, which shield allows deposition of material on a substrate to be coated, but which shields parts of said chamber from deposition of material.

13. A magnetron sputtering system according to claim 1, characterized in that said magnetic device comprises two co-axial annular permanent magnets, whereby a first permanent magnet is aligned with the central area of the sputtering surface of said cathode plate, a second permanent magnet is aligned with the circumferential area of the sputtering surface of said cathode plate and said first permanent magnet is stronger than said second permanent magnet and is mounted closer to the sputtering surface of said cathode plate.

14. A magnetron sputtering system according to claim 13, characterized in that said first permanent magnet comprises a plurality of stacked-together permanent magnet parts, and said second permanent magnet comprises a smaller number of magnet parts.

15. A magnet sputtering system according to claim 13, characterized in that a yoke is mounted on said two co-axial annular permanent magnets.

\* \* \* \* \*